United States Patent
Chung et al.

[19]

[11] Patent Number: 5,991,188
[45] Date of Patent: Nov. 23, 1999

[54] NON-VOLATILE FERROELECTRIC MEMORY WITH SECTION PLATE LINE DRIVERS AND METHOD FOR ACCESSING THE SAME

[75] Inventors: Yeon-Bae Chung; Byung-Gil Jeon, both of Kyunggi-do, Rep. of Korea

[73] Assignee: Samsung Electronics Co., Ltd., Suwon, Rep. of Korea

[21] Appl. No.: 09/084,390

[22] Filed: May 27, 1998

[30]  Foreign Application Priority Data

Jun. 2, 1997 [KR] Rep. of Korea ................. 97-22759

[51] Int. Cl.$^6$ .................................. G11C 11/22
[52] U.S. Cl. ................... 365/145; 365/149; 365/185.2; 365/185.11
[58] Field of Search ................ 365/145, 185.11, 365/117, 149, 230.03, 65, 185.2, 185.25

[56]  References Cited

U.S. PATENT DOCUMENTS

| | | | |
|---|---|---|---|
| 5,297,077 | 3/1994 | Imai et al. ........................ | 365/145 |
| 5,373,463 | 12/1994 | Jones, Jr. ......................... | 365/145 |
| 5,574,679 | 11/1996 | Ohtsuki et al. ................... | 365/145 |
| 5,592,410 | 1/1997 | Verhaeghe et al. .............. | 365/145 |
| 5,598,366 | 1/1997 | Kraus et al. ..................... | 365/145 |
| 5,754,466 | 5/1998 | Arase ............................... | 365/145 |

*Primary Examiner*—David Nelms
*Assistant Examiner*—David Lam
*Attorney, Agent, or Firm*—Jones Volentine, L.L.P.

[57]  ABSTRACT

A ferroelectric memory device with plate line segments free from the capacitive plate line segment coupling in a read/write operation, and a method of accessing the memory device. The memory device includes a floating protection circuit for protecting unselected plate line segments from being floated during a read/write operations. The floating protection circuit prevents data disturbance due to the capacitive plate line segment coupling. In a data write method of the memory device, a sense amplifier corresponding to a bit line is activated after a voltage corresponding to a data bit to the bit line is applied. In a data read method of the memory device, the sense amplifier is activated and then a column gate corresponding to the bit line is selected.

19 Claims, 9 Drawing Sheets

NON-VOLATILE FERROELECTRIC MEMORY WITH SECTION PLATE LINE DRIVERS AND METHOD FOR ACCESSING THE SAME

FIELD OF THE INVENTION

The present invention relates generally to semiconductor memory devices and, more particularly, to a non-volatile semiconductor random access memory device having ferroelectric cell capacitors.

BACKGROUND OF THE INVENTION

The characteristic that defines ferroelectricity is its spontaneous polarization which can be reversed by an electric field. Various ferroelectric materials are known, such as the PZT family of lead zirconate and titanate compounds, Phase III potassium nitride, bismuth titanate, or the like, each of which has a Perovskite structure. When the proper electrical field is applied to a ferroelectric material, its polarization is arranged in the same direction. The ferroelectric material remains in essentially the same polarization when the electric field is removed. This phenomena is known the spontaneous polarization. Because the direction of an applied electric field can change polarizations and the ferroelectric material has two threshold voltages for the reverse of its polarization, it can be thought of as a bi-stable capacitor.

Generally, in areas that require high speed and symmetrical read/write characteristics and extremely high endurance, a volatile SRAM or DRAM is used. In areas where a nonvolatile semiconductor memory is desired, an EPROM, EEPROM or flash memory is used although their characteristics are inferior in write speed and endurance to DRAMS and SRAMS. When large capacity and low cost are both desired, magnetic memories are used. Ferroelectric memory has the potential to replace such all existing electronic memories (i.e., semiconductor memories and magnetic memories).

Referring to FIG. 1A, there is shown a ferroelectric memory cell MC having a cell capacitor $C_F$ and an access transistor Tr acting as a switching device. Capacitor $C_F$ comprises a plate made of ferroelectric material used as a capacitor dielectric and two plate electrodes formed on the opposite two surfaces of the plate. One plate electrode of the ferroelectric capacitor $C_F$ is coupled via the source-drain conduction path of the access transistor Tr to a bit line BL, and the other plate electrode of the capacitor $C_F$ is coupled to a plate line PL. The gate electrode of the transistor Tr is coupled to a word line WL.

When a voltage is applied to the ferroelectric plate of the capacitor $C_F$, the plate is polarized in the direction of the electric field. The switching threshold for changing the polarization state of the ferroelectric capacitor $C_F$ is defined as the coercive voltage. A ferroelectric material has a polarization-voltage characteristic which exhibits hysteresis, and the flow of current to the capacitor $C_F$ depends on its polarization state. If the voltage applied to the capacitor $C_F$ is greater than the coercive voltage, then the capacitor $C_F$ may change polarization states depending on the polarity of the applied voltage. Once polarized by applying a voltage to it in one direction or the opposite direction, the ferroelectric capacitor $C_F$ remains polarized even after the application of the voltage is stopped. Thus, the ferroelectric capacitor $C_F$ can store either logic "one" or logic "zero" according to the state of polarization of the ferroelectric material between two plate electrodes.

FIGS. 1B and 1C illustrate hysteresis curves of polarization of the ferroelectric material in capacitor $C_F$ in accordance with logic states thereof. In each FIG. 1B or 1C, the abscissa (or X axis) represents an external voltage V applied across the two plate electrodes of the capacitor $C_F$, and the ordinate (or Y axis) represents polarization charge Q on the ferroelectric material between two plate electrodes. Referring to FIGS. 1B and 1C, it will be seen that two stable states at points "a" and "e" on the hysteresis curve exist even when no voltage is applied across the ferroelectric capacitor $C_F$. This is because the prior history of the voltage applied across the capacitor $C_F$ determines the stable state 'a' or 'e' which results when voltage is removed. So, point 'a' can represent logic "1", and point 'e' can represent logic "0".

When a voltage Ve is applied to one plate electrode of the ferroelectric capacitor $C_F$, namely, when a voltage Ve is applied to the plate line PL in a negative direction while transistor Tr is conducting, the charge stored in the capacitor $C_F$ is fed out onto bit line BL. The amount of the charge is Q1 if the ferroelectric is in the state at point 'a' (i.e., if logic "1" is stored in the capacitor $C_F$) as shown in FIG. 1B, but the amount of the charge is Q0 if the ferroelectric is in the state at point 'e' (i.e., if a logic "0" is stored in the capacitor $C_F$) as shown FIG. 1C. A resulting change in voltage on the bit line BL is detected by a differential sense amplifier (not shown) by comparison with a reference voltage. The reference voltage is an intermediate between a voltage developed on bit line BL by the charge Q1 and another voltage developed on bit line BL by the charge Q0.

When the voltage—Ve is applied across a ferroelectric capacitor $C_F$ in order to read the data from the capacitor, the ferroelectric capacitor is not reversely polarized if the capacitor has been polarized in a first direction and stores a "0" bit (point 'e'). However, when the voltage—Ve is applied across the ferroelectric capacitor in order to read data from the capacitor, the ferroelectric capacitor is reversely polarized and its data state moves to point 'e' if the capacitor has been polarized in a second direction and stores a "1" bit (point 'a'). In this case, the plate may be polarized in the first direction (point 'a' corresponding to a logic "0") after the "1" bit has been read from the ferroelectric capacitor. To retain correct data, therefore, the capacitor should be polarized in the second direction again after the "1" bit has been read from the capacitor.

FIG. 2A illustrates a core portion of a ferroelectric memory device in accordance with prior art, for example, U.S. Pat. No. 5,592,410 by Verhaeghe et al. The prior art memory device includes a ferroelectric memory cell array 10, a row decoder 20, sense amplifiers SA_0, SA_1, etc., bit lines BL_0, BL_1, etc., word lines WL_0, WL_1, etc., and plate lines PL_0, PL_1, etc., substantially running in parallel to the word lines WL_0, WL_1, etc. The memory cells MC00, MC01, MC10, MC11, etc., are arranged in intersecting rows and columns. A memory cell MCij has a ferroelectric cell capacitor $C_F$ and an access transistor Tr. One plate electrode of the capacitor $C_F$ is coupled via the source-drain conduction path of the access transistor to a corresponding bit line, and the other plate electrode of the capacitor $C_F$ is coupled to a corresponding plate line. The gate electrode of the transistor Tr is coupled to a corresponding word line.

In the above-mentioned prior art memory device, however, since a row decoder is adopted for driving the word lines and plate lines simultaneously, the chip area may be increased which may reduce the integration. Also, the number of cells that a word line can drive may usually be limited to 32 cells/PL or 64 cells/PL due to RC delay of PL driving signal.

FIG. 2B illustrates a portion of another prior art ferroelectric memory device. Such a prior art arrangement may be suitable for higher integration and operating speed, which is disclosed in, for example, U.S. Pat. Nos. 5,598,366 by Kraus et al. and 5,373,463 by Jones Jr. Referring to FIG. 2B, this memory device has the same structure as the device of FIG. 2A with the exception that it includes a plate line PL, a control circuit 30 for driving the plate line PL, plate line segments SPL__0, SPL__1, etc., each running in parallel with a corresponding word line and coupled to a predetermined number of cells, and plate select transistors ST0, ST1, etc., for selectively coupling the plate line segments SPL__0, SPL__1, etc., to the plate line PL. The gate electrodes of plate select transistors ST0, ST1, are coupled to corresponding word lines WL__0, WL__1, etc.

When a word line is selected during a read/write operation, a corresponding plate select transistor becomes conducting, so that the plate line and a corresponding plate line segment are coupled to each other via the source-drain conduction path of the plate select transistor. At this time, the remaining plate line segments corresponding to unselected word lines are floated by corresponding coupling transistors which remain non-conducting.

According to this prior art plate line driving technique, there may arise a problem in that the voltages on the floated plate line segments adjacent to the selected plate line are changed on account of their capacitive coupling, causing the sensing margin to be reduced and the data stored in memory cells to be disturbed or destroyed in a worse case.

Also, in prior art data write operation, the data line-to-bit line transmission of write data may be carried out after cell data sensing has been completed. Thus, in case the latch type sense amplifier is used, it may often be needed to invert the data state of the latch amplifier because of disagreement between the sensed cell data and the externally applied write data. To invert the state of the latch amplifier coupled to polysilicon bit lines with relatively large resistance, a large amount of current will be necessary, thereby increasing power consumption of the device.

SUMMARY OF THE INVENTION

An object of the present invention, accordingly, is to overcome the problems existing in the prior art semiconductor memories, and to provide a non-volatile ferroelectric memory device which is capable of performing faster and more stable read and write operations than the prior art ferroelectric memory devices described above.

It is another object of the present invention to provide a ferroelectric memory device with reduced operating current.

It is still another object of the present invention to provide a ferroelectric memory device with plate line segments which are free from the capacitive plate line segment coupling in read and write operations so as to prevent data disturbance.

It is still another object of the present invention to provide a method of accessing a ferroelectric memory device fast and stably.

According to an aspect of the present invention, a random access memory device includes a plurality of word lines arranged in a first direction, a plurality of bit lines arranged in a second direction, a plate line arranged into a plurality of plate line segments, a plate line driver for driving the plate line, an array of a plurality of memory cells arranged in the first and second directions, and a floating protection circuit for protecting unselected ones of the plate line segments from being floated during a read/write operation. Each memory cell is coupled to corresponding one of the word lines, corresponding one of the bit lines and corresponding one of the plate line segments. A plate select circuit for selecting one of the plate line segments and coupling the selected plate line segment to the plate line in response to word line driving signals. The floating protection circuit includes a plurality of switch elements, each being coupled between corresponding one of said plate line segments and a reference voltage and closing/opening in response to corresponding one of the word line driving signals.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings, wherein.

DETAILED DESCRIPTION OF THE PREFERRED EMBODIMENT

In the following description for purposes of explanation, specific numbers, materials and configurations are set forth in order to provide a thorough understanding of the present invention. However, it will be apparent to those skilled in the art that the present invention may be practiced without the specific details. In other instances, well known circuits are shown in block diagram form in order not to obscure the present invention.

Figure 3:
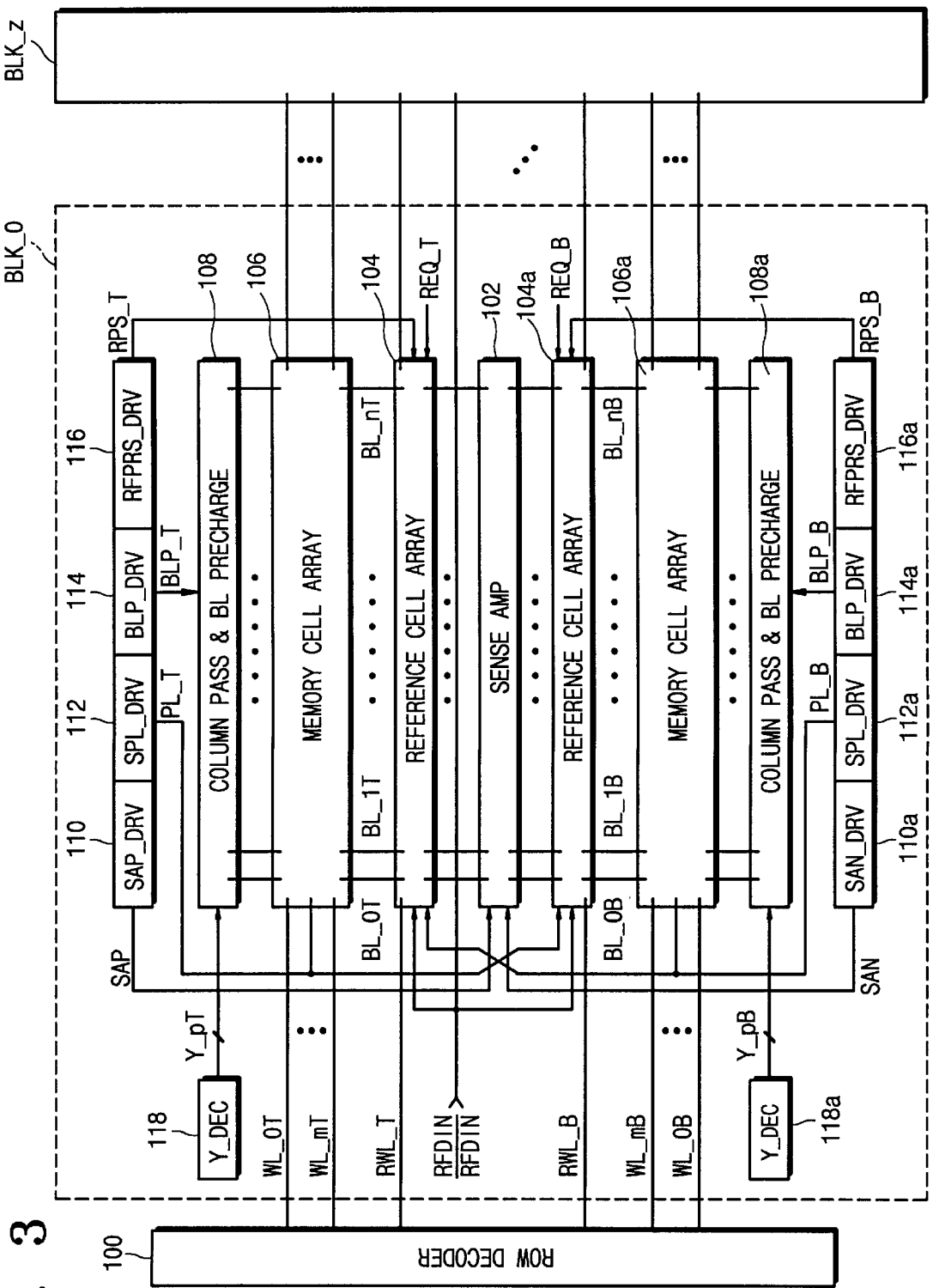
FIG. 3 is a block diagram illustrating a ferroelectric memory device in accordance with an embodiment of the present invention.

FIG. 3 is a block diagram illustrating an embodiment of a nonvolatile ferroelectric memory device according to the present invention. The ferroelectric memory includes a row decoder 100, a plurality of (i.e., z+1) memory blocks BLK__0, BLK__1, . . . , BLK__z, a plurality of word lines WL__0T, WL__1T, . . . , WL__mT, WL__0B, WL__1B, . . . , WL__mB arranged in rows, two reference word lines RWL__T and RWL__B arranged parallel to the word lines, a plurality of bit lines arranged in columns, and a plurality of plate lines substantially parallel to the bit lines.

Each of the memory blocks BLK__0, BLK__1, . . . , and BLK__z has a well-known latch type sense amplifier circuit 102 disposed in its center, a plurality of bit lines BL__0T, BL__1T, . . . , BL__nT, BL__0B, BL__1B, . . . , BL__nB arranged in its columns, and two plate lines PL__T and PL__B substantially parallel to the bit lines. Upper section and lower section of each memory block BLK__0, BLK__1, ..., or BLK_z are symmetrical with respect to its sense amplifier circuit 102 consisting of a plurality of latch sense amplifiers (not shown) which is well known in the art. The upper section of each block BLK_0, BLK_1, ..., or BLK_z further includes a reference cell array 104, a memory cell array 106, a column pass and bit line precharge circuit 108, a P-latch amp driver 110 for driving P-type latch amplifiers (not shown) of the sense amplifier circuit 102, a plate line driver 112 for driving a plate line PL_T, a bit line precharge driver 114, a reference gate driver 116, and a column decoder 118. Also, the lower section of each block further includes a reference cell array 104a, a memory cell array 106a, a column pass and bit line precharge circuit 108a, an N-latch amp driver 110a for driving N-type latch amplifiers (not shown) of the sense amplifier circuit 102, a plate line driver 112a for driving a plate line PL_B, a bit line precharge driver 114a, a reference gate driver 116a, and a column decoder 118a. The upper section reference cell array 104 provides a reference voltage needed for data sensing to the lower section memory cell array 106a. The lower section reference cell array 104a provides the reference voltage to the upper section memory cell array 106.

In a memory block BLK_0, BLK_1, ..., or BLK_z, plate line PL_T is disposed between the upper section plate line driver 112 and the upper section memory cell array 106, and further extended to the lower section reference cell array 104a. Plate line PL_B between the lower section plate line driver 112a and the lower section memory cell array 106a, and further extended to the upper section reference cell array 104. The word lines WL_0T, WL_1T, ..., WL_mT, WL_0B, WL_1B, ..., WL_mB and the bit lines BL_0T, BL_1T, ..., BL_nT, BL_0B, BL_1B, ..., BL_nB are arranged to intersect each other. Also, reference word lines RWL_T and RWL_B and the bit lines BL_0T, BL_1T, BL_nT, BL 0B, BL_1B, BL_nB intersect each other. In memory cell arrays 106, 106a and reference memory cell arrays 104 and 104a, ferroelectric memory cells are disposed at the intersection positions.

In a memory block BLK_0, BLK_1, ..., or BLK_z, a P-latch amp drive line SAP is coupled between a P-latch amp driver 110 and a sense amplifier circuit 102, and an N-latch amp drive line SAN is coupled between an N-latch and the sense amplifier circuit 102. A bit line precharge driver 114 and a column decoder 118 are coupled to a column pass and bit line precharge circuit 108 via a precharge drive line BLP_T and a gate drive line Y_pT. A bit line precharge driver 114a and a column decoder 118a are also coupled to a column pass and bit line precharge circuit 108a via a precharge drive line BLP_B and a gate drive line Y_pB. It should be noted that the gate drive lines Y_pT and Y_pB both are fed with a column driving signal, this will be explained in detail with reference to a timing diagram. Upper section reference cell array 104 is coupled to a reference gate driver 116 via a reference gate drive line RPS_T, and it is also coupled to an equalizer drive line REQ_T. Lower section reference cell array 104a is coupled to a reference gate driver 116a via another reference gate drive line RPS_B, and it is also coupled to another equalizer drive line REQ_B. The reference cell arrays 104 and 104a are coupled to a pair of complementary reference drive lines RFDIN and $\overline{\text{RFDIN}}$.

Figure 4:
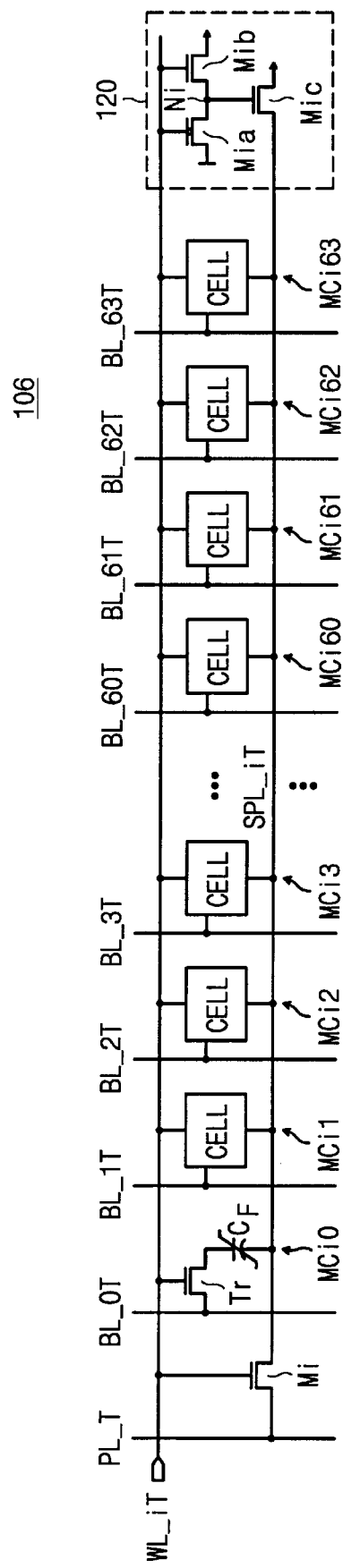
FIG. 4 is a circuit diagram illustrating a portion of a memory cell array of FIG. 3.

Referring to FIG. 4, a partial arrangement of a upper section memory cell array 106 associated with one word line WL_iT (where i=0, 1, ..., or m), which has 64 ferroelectric memory cells MCi0 through MCi63 (i=0, 1, ..., or m) arranged in one row and 64 columns, is illustrated. Even though entire arrangement is not shown in FIG. 4, (m+1)×64 memory cells are arranged in m+1 rows and 64 columns. Plate line PL_T is arranged into m+1 plate line segments SPL_iT (i=0, 1, ..., and m) via a plate select circuit consisting of m+1 field effect transistors (FETs) Mi (i=0, 1, , and m). The source-drain conduction path of a plate select transistor Mi is coupled between plate the line PL_T and a corresponding plate line segment SPL_iT (i=0, 1, , or m) and the gate electrode thereof is coupled to a corresponding word line WL_iT (i=0, 1, , or m). A memory cell consists of a ferroelectric capacitor $C_F$ and an access transistor Tr. One plate electrode of a ferroelectric capacitor $C_F$ is coupled to a corresponding plate line segment SPL_iT and the other plate electrode thereof is coupled to a corresponding bit line via the conduction path of the access transistor Tr. The gate electrode of the access transistor Tr is coupled to a corresponding word line WL_iT.

Between each word line WL_iT and each plate line segment SPL_iT, a switch element 120 is provided to prevent unselected plate line segments from being floated. A memory cell array 106 or 106a includes a plurality of switch elements acting as a plate floating protection circuit which protects unselected plate line segments from being floated during a read/write operation. Each switch element 120 is coupled between a corresponding plate line segment and a reference voltage (i.e., ground voltage) and it closes/opens in response to a corresponding word line driving signal. The switching element 120 includes a switching transistor device Mic having a conduction path coupled between a corresponding plate line segment and a second reference voltage and a control terminal, and a switch driver for providing switch driving signal to the control terminal of the switching device in response to a corresponding word line driving signal. The switch driver includes an inverter consisting of a P-channel pull-up MOS FET Mia (i=0, 1, or m) and an N-channel pull-down MOS FET Mib. The input terminal of an inverter used as a switch driver is coupled to a corresponding word line and the output terminal thereof is coupled to the control terminal of a corresponding switching device Mic. Specifically, a pull-up FET Mia of an inverter has a gate electrode coupled to a corresponding word line and a source-drain path coupled between a power supply voltage Vcc and an output node Ni (i=0, 1, ..., or m) coupled to the gate electrode of a switching device Mic, and a pull-down FET Mib thereof has a gate electrode coupled to the corresponding word line and a source-drain path coupled between the node Ni and a reference voltage (i.e., ground voltage Vss).

In case a word line WL_iT is selected by a word line driving signal from row decoder 100, i.e., if the word line goes high, then plate select transistor Mi is turned on and switching device Mic is turned off. So, a corresponding plate line segment SPL_iT is coupled to plate line PL_T via transistor Mi and electrically isolated from the reference voltage by transistor Mic.

If a word line WL_iT is not selected and so it goes low, then plate select transistor Mi is turned off and switching device Mic is turned on. So, a corresponding plate line segment SPL_iT is electrically isolated from plate line PL_T by transistor Mi and grounded by transistor Mic so as not to be floated. This plate floating protection circuit can overcome the disadvantages of the prior art ferroelectric memory with plate line segments, that is, the problems that the sensing margin is reduced and the data stored in memory cells is disturbed or destroyed on account of the capacitive coupling.

The lower section memory cell array 106a of a memory block BLK_0, BLK_1, ..., or BLK_z has the same arrangement as that of the upper section memory cell array 106 described above with exception that its memory cells are coupled to the word lines WL__iB (i=0, 1, . . . , and m), the bit lines BL__0B through BL__63B, and the plate line segments SPL__iB (i=0, 1, . . . , and m). The memory cell array 106a also includes a plurality of switch elements each of which is coupled between a corresponding word line WL__iB (i=0, 1, . . . , or m) and a corresponding plate line segment SPL__iB (i=0, 1, . . . , or m) and it closes/opens in response to a corresponding word line driving signal.

Figure 5:
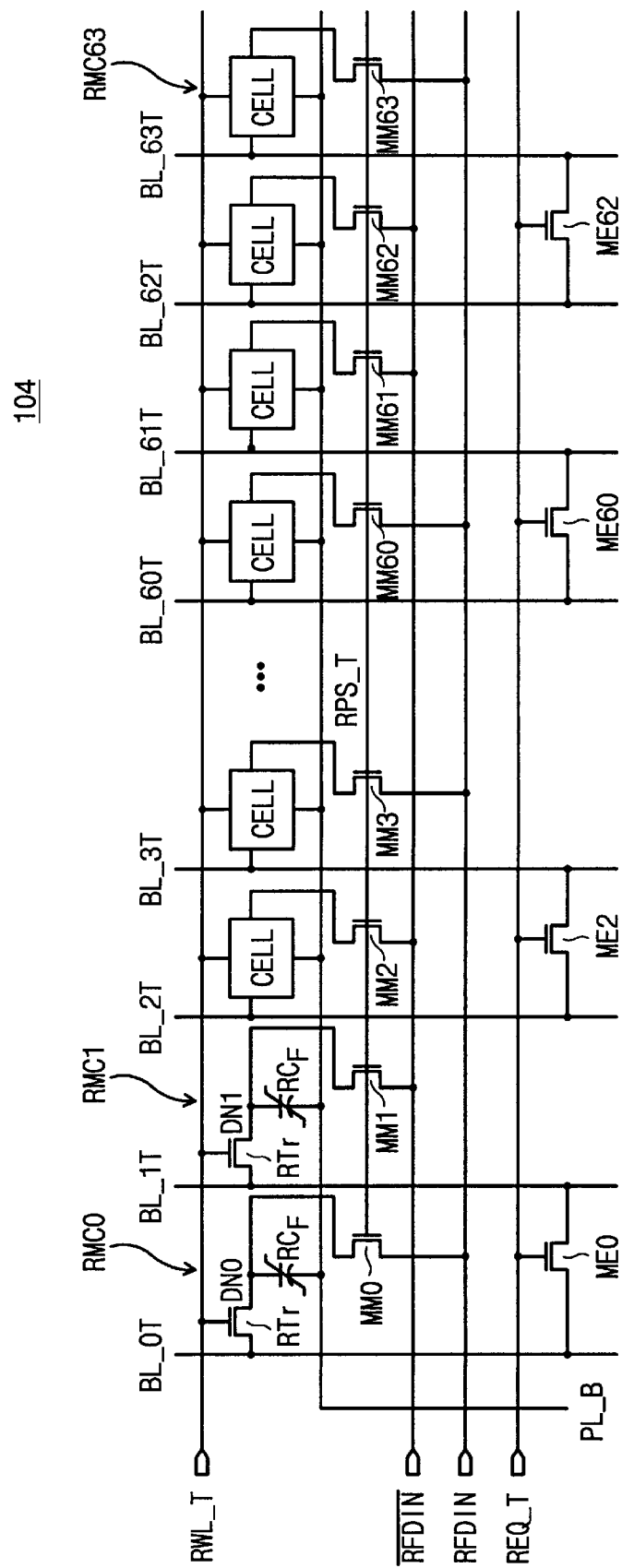
FIG. 5 is a circuit diagram illustrating a reference cell array of FIG. 3.

FIG. 5 illustrates a reference cell array 104 in upper section of a memory block BLK__0, BLK__1, . . . , or BLK__z shown in FIG. 3. A reference cell RMCj (j=0, 1, . . . , or 63) includes a ferroelectric capacitor $RC_F$ and an access transistor RTr like a memory cell, but its configuration is somewhat other than that of the memory cell. That is, one plate electrode DNj (j=0, 1, . . . , 63) of a capacitor $RC_F$ is coupled to a corresponding bit line BL__j (j=0, 1, . . . , or 63) via the conduction path of the access transistor RTr like a memory cell capacitor, but the other electrode of the reference cell capacitor $RC_F$ is directly coupled to the lower section plate line PL__B without any plate line segment and plate select transistor, unlike memory cell capacitor. The gate electrode of the access transistor RTr is coupled to reference word line RWL__T. The reference cell array 104 further includes reference gate transistors MM0, MM1, . . . , and MM63 and equalizer transistors ME0, ME2, . . . , and ME 62. Each equalizer transistor ME0, ME2, . . . , or ME 62 is provided for a corresponding bit line pair BL__0T and BL__1T, BL__2T and BL__3T, . . . , or BL__62T and BL__63T. The conduction path of each equalizer transistor ME0, ME2, . . . , or ME 62 is coupled between two adjacent bit lines BL__0T and BL__1T, BL__2T and BL__3T, . . . , or BL__62T and BL__63T, and the gate electrode thereof is coupled to the equalizer drive line REQ__T. Thus, when the equalizer drive line REQ__T goes high and the equalizer transistors ME0, ME2, . . . , and ME 62 all are turned on, the respective bit line pair BL__0T and BL__1T, BL__2T and BL__3T, . . . , or BL__62T and BL__63T are at the same voltage level. Meanwhile, if the equalizer drive line REQ__T goes low and the equalizer transistors ME0, ME2, . . . , and ME 62 all are turned off, then the respective bit line pair BL 0T and BL__1T, BL__2T and BL__3, or BL__62T and BL__63T can be different from each other in voltage level. The conduction path of reference gate transistor MMk (k=0, 3, 4, 7, , 60, or 63) is coupled between the electrode DNk of a corresponding cell capacitor $RC_F$ and the reference drive line RFDIN, whereas that of reference gate transistor MMl (l=1, 2, 5, 6, . . . , 61, or 62) is coupled between the electrode DNl of a corresponding cell capacitor $RC_F$ and the reference drive line $\overline{\text{RFDIN}}$. The gate electrodes of reference gate transistors MM0 through MM63 are commonly coupled to reference gate drive line RPS__T. A pair of adjacent reference cells RMC0 and RMC1, RMC2 and RMC3, . . . , RMC62 and RMC 63 store complementary data i.e., a logic "one" data and a logic "zero" data suppled via the complementary reference drive lines RFDIN and $\overline{\text{RFDIN}}$. For purposes of explanation, assume that power supply voltage Vcc is approximately 3 volts, that a logic one data corresponds to 3 volts, and that a logic zero data corresponds to 0 volts (i.e., ground voltage Vss). When the equalizer drive line REQ__T is activated and the equalizer transistors ME0, ME2, . . . , and ME 62 are turned on, the respective bit line pair BL__0T and BL__1T, BL__2T and BL__3T, . . . , or BL__62T and BL__63T have the same voltage ('reference voltage') by charge sharing. As the reference voltage, a voltage which is intermediate between a voltage developed on a bit line coupled to a memory cell by the charge Q1 of FIG. 1B and another voltage developed on a bit line coupled to a reference cell by the charge Q0 FIG. 1C can be used. In this embodiment, the reference voltage of about Vcc/2 is used.

The lower section reference cell array 104a of a memory block BLK__0, BLK__1, . . . , or BLK__z has the same configuration as that of the upper section reference cell array 104 described above with exception that its reference cells are coupled to the reference word line RWL__B, the bit lines BL__0B through BL__63B, and the plate line PL__iT.

Figure 6:
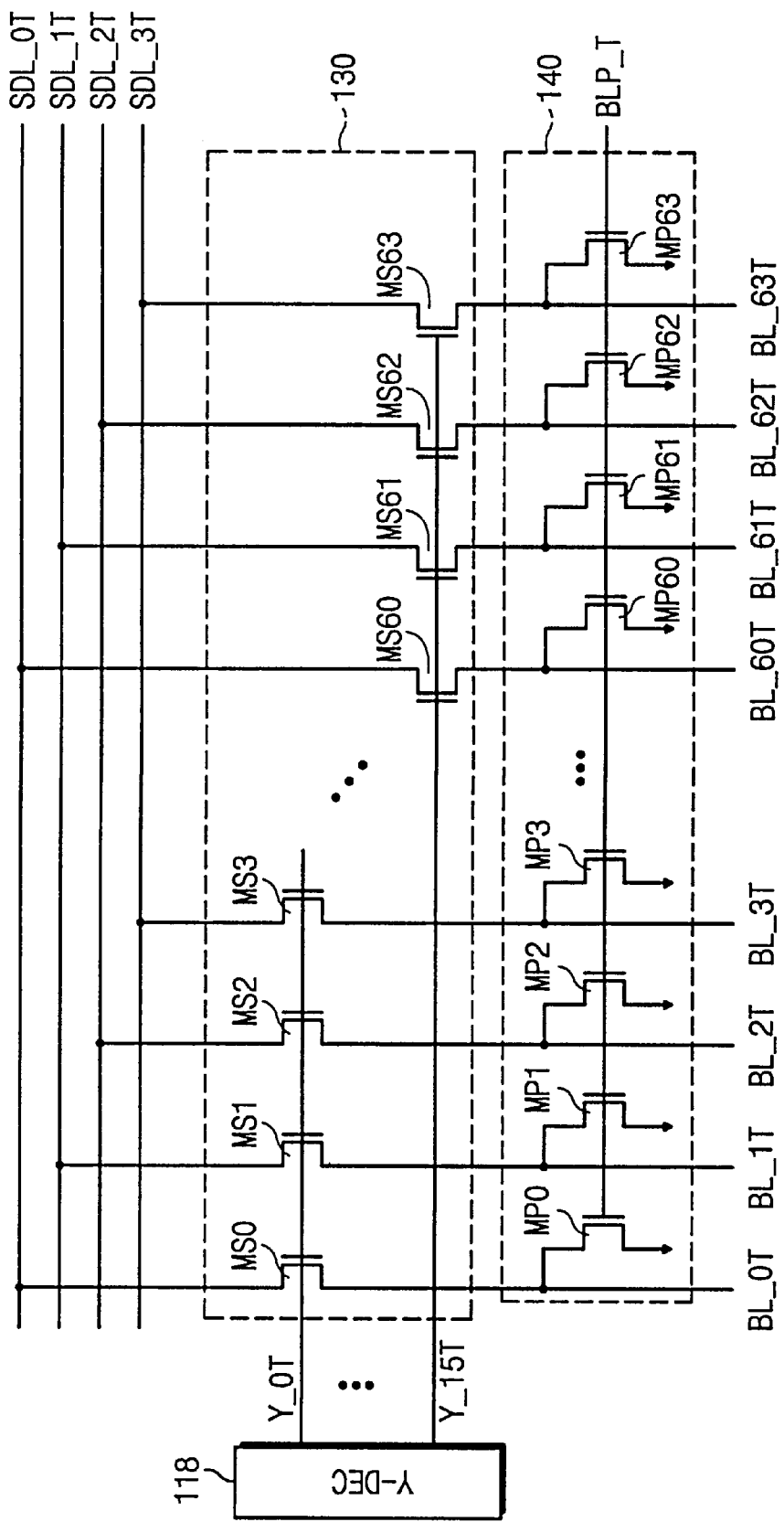
FIG. 6 is a circuit diagram illustrating a column pass and bit line precharge circuit of FIG. 3.

Referring to FIG. 6, a column pass and bit line precharge circuit 108 of FIG. 3 is illustrated. In FIG. 6, reference numeral 130 represents a column pass portion, and 140 represents a bit line precharge portion.

The column pass portion 130 is disposed between section data lines SDL__0T, SDL__1T, SDL__2T and SDL__3T and bit lines BL__0T through BL__63T. The column pass portion 130 includes 64 column select transistors MS0 through MS63. Four adjacent bit lines BL__tT, BL__tT, BL__tT and BL__tT (t=0, 4, 8, . . . , 60) are coupled to the section data lines SDL__0T, SDL__1T, SDL__2T and SDL__3T via four corresponding column select transistors MSt, MSt+1, MSt+2 and St+3 (t=0, 4, 8, . . . , 60) whose gate electrodes are coupled to a corresponding gate drive line Y__pT (p=0, 1, . . . , 15), respectively. For example, bit lines BL__0T, BL__1T, BL__2T and BL__3T are coupled via column select transistors MS0 , MS1, MS2 and MS3 to section data lines SDL__0T, SDL__1T, SDL__2T and SDL__3T, respectively. The gate electrodes of the transistors MS0 , MS1, MS2 and MS3 are commonly coupled to the gate drive line Y__0T.

The bit line precharge portion 140 includes 64 precharge transistors MP0 through MP63. The conduction path of each precharge transistor MPj (j=0, 1, . . . , or 7415 63) is coupled between a corresponding bit line BL__jT (j=0, 1, . . . , or 63) and the ground voltage. The gate electrodes of the bit line precharge transistor MP0 through MP63 are coupled to the precharge drive line BLP__T.

The lower section column pass and bit line precharge circuit 108a in a memory block BLK__0, BLK__1, . . . , or BLK__z has the same configuration as that of the upper section column pass and bit line precharge circuit 108 described above.

Figure 7:
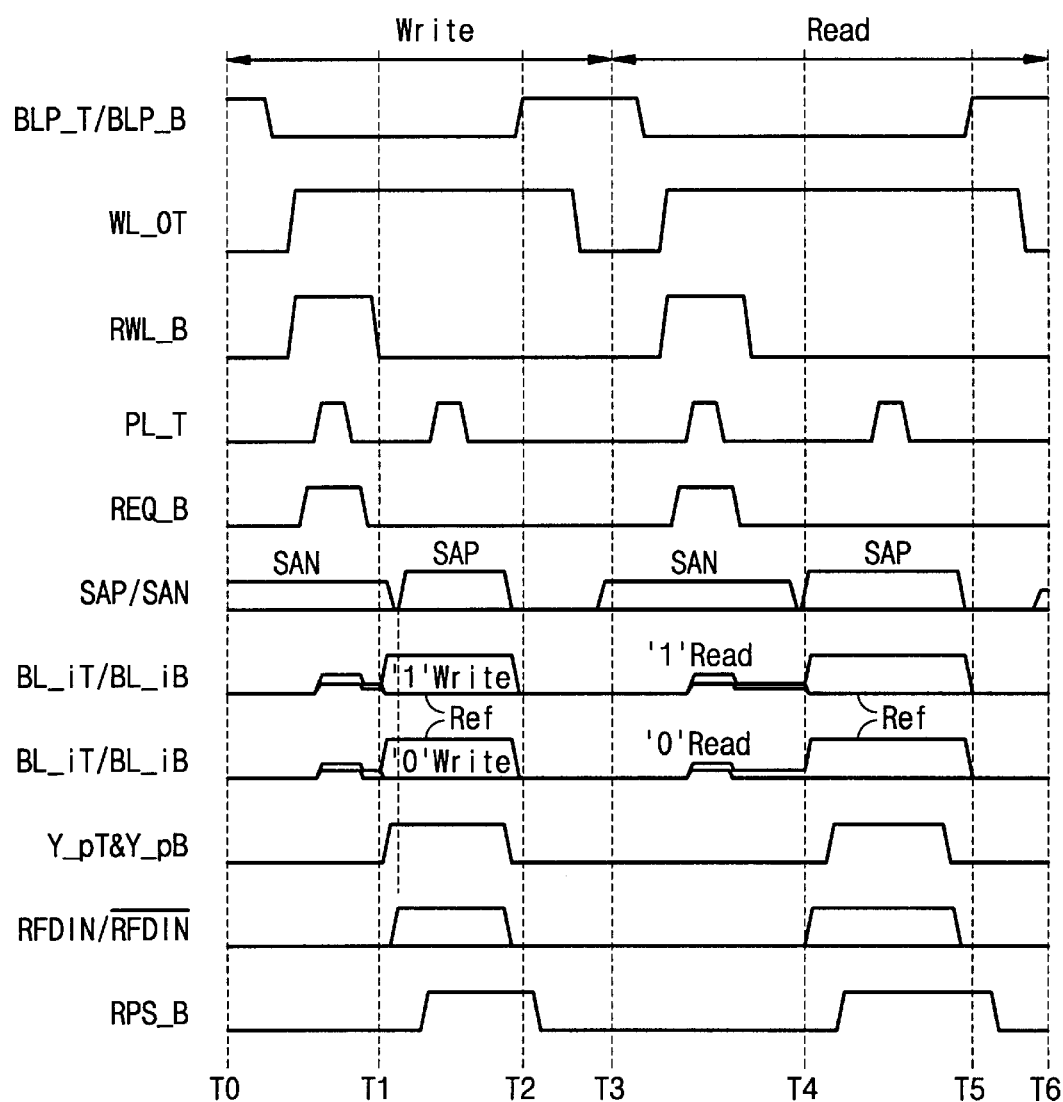
FIG. 7 is a timing diagram for write and read operations of a ferroelectric memory device in accordance with the present invention.

FIG. 7 is a timing diagram for write and read operations of a ferroelectric memory device in accordance with a preferred embodiment the present invention. The write and read operations of a ferroelectric memory device of FIGS. 3 through 6 will now be explained with reference to the timing diagram of FIG. 7. It will be assumed for ease of description that complementary data of a logic "one" data (Vcc) and a logic "zero" data (Vss) have been stored in each adjacent reference cell pair (e.g., RMC0 and RMC1) of the reference cell arrays 104 and 104a, and the word line WL__0T is to be selected.

Referring to FIG. 7, in a write cycle, the time interval T0-T1 is a cell data sensing period for protection of data stored in unselected cells, and the following interval T1-T2 is an actual write period.

At the time T0, first, the precharge drive lines BLP__T and PLP__B are activated and so all bit lines BL__iT and BL__iB (i=0, 1, . . . , 63) are precharged to the ground voltage level Vss (i.e., 0 volts) by the upper and lower section bit line precharge circuits 140 in respective memory blocks BLK__ 0, BLK__1, . . . , and BLK__z. At this time, P-latch amp drive line SAP and N-latch amp drive line SAN both are inactivated, so that they are maintained at high and low levels, respectively. Thereafter, the word line WL__0T and the reference word line RWL__B are selected and the equalizer drive line REQ__B is activated after the precharge drive lines BLP__T and PLP__B have been deactivated. Then, plate line segment SPL__0T is selected by the plate select transistor M0 and the corresponding switching transistor M0c in the switch element 120 coupled between the selected word line WL__0T and the selected plate line segment SPL__0T is turned off. However, the switching devices M1c, M2c, . . . , Mmc in other switch elements coupled between the unselected word lines WL__1T, WL__2T, . . . , WL63 and the unselected plate line segments SPL__1T, SPL__2T, . . . , SPL__mT are turned on, so that the unselected plate line segments SPL__1T, SPL__2T, . . . , SPL__mT all are grounded. Therefore, the data disturbance due to the capacitive plate line segment coupling can be prevented since the unselected plate line segments SPL__1T, SPL__2T, . . . , SPL__mT are not floated. Thus, a stable sensing margin can be assured without interference between adjacent signals.

Figure 1A:
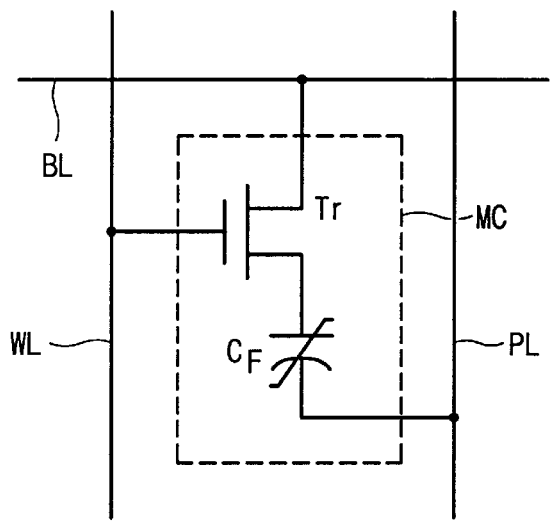
FIG. 1A is a circuit diagram of a typical ferroelectric memory cell consisting of one transistor and one capacitor.
Figure 1B:
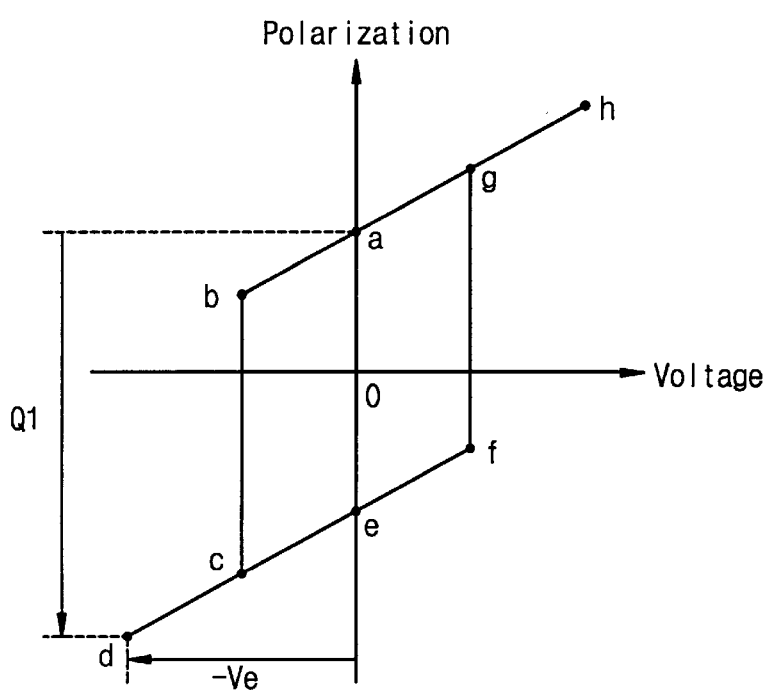
FIGS. 1B and 1C illustrate the hysteresis of polarization in the ferroelectric capacitor of FIG. 1A.
Figure 1C:
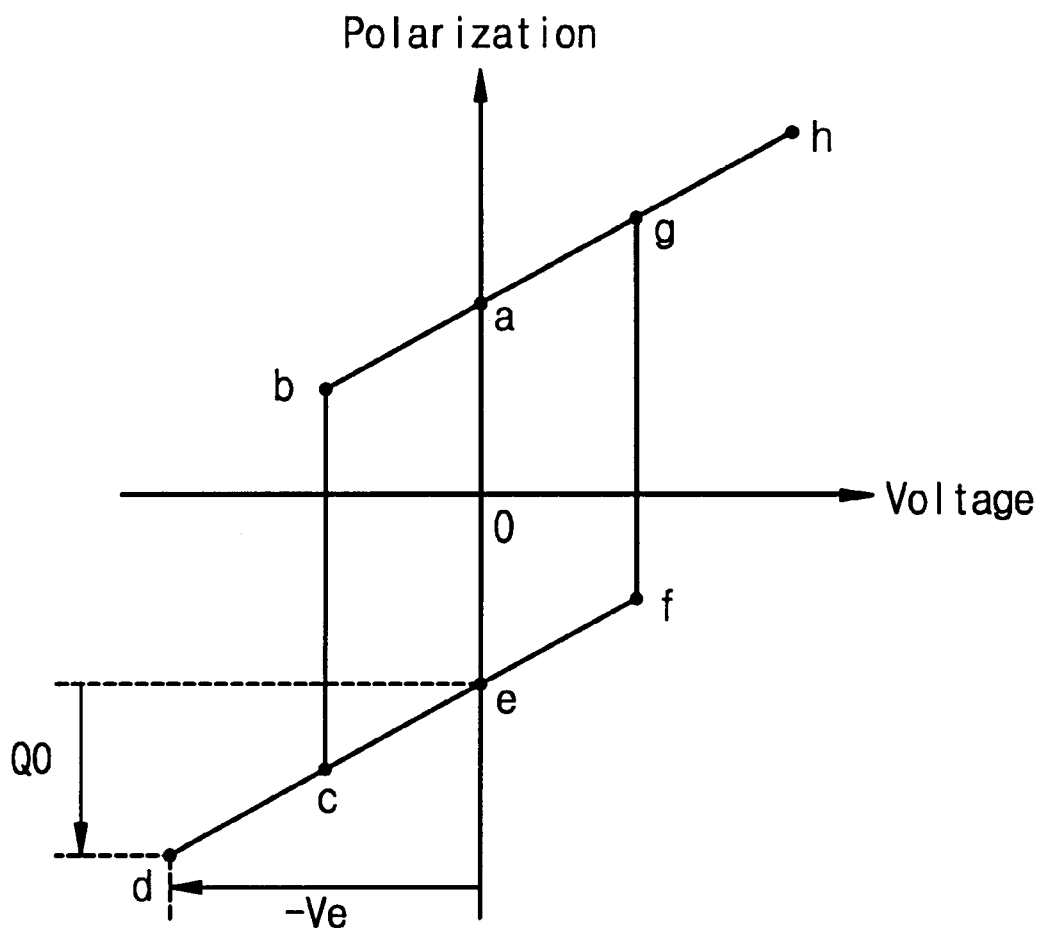
Figure 2A:
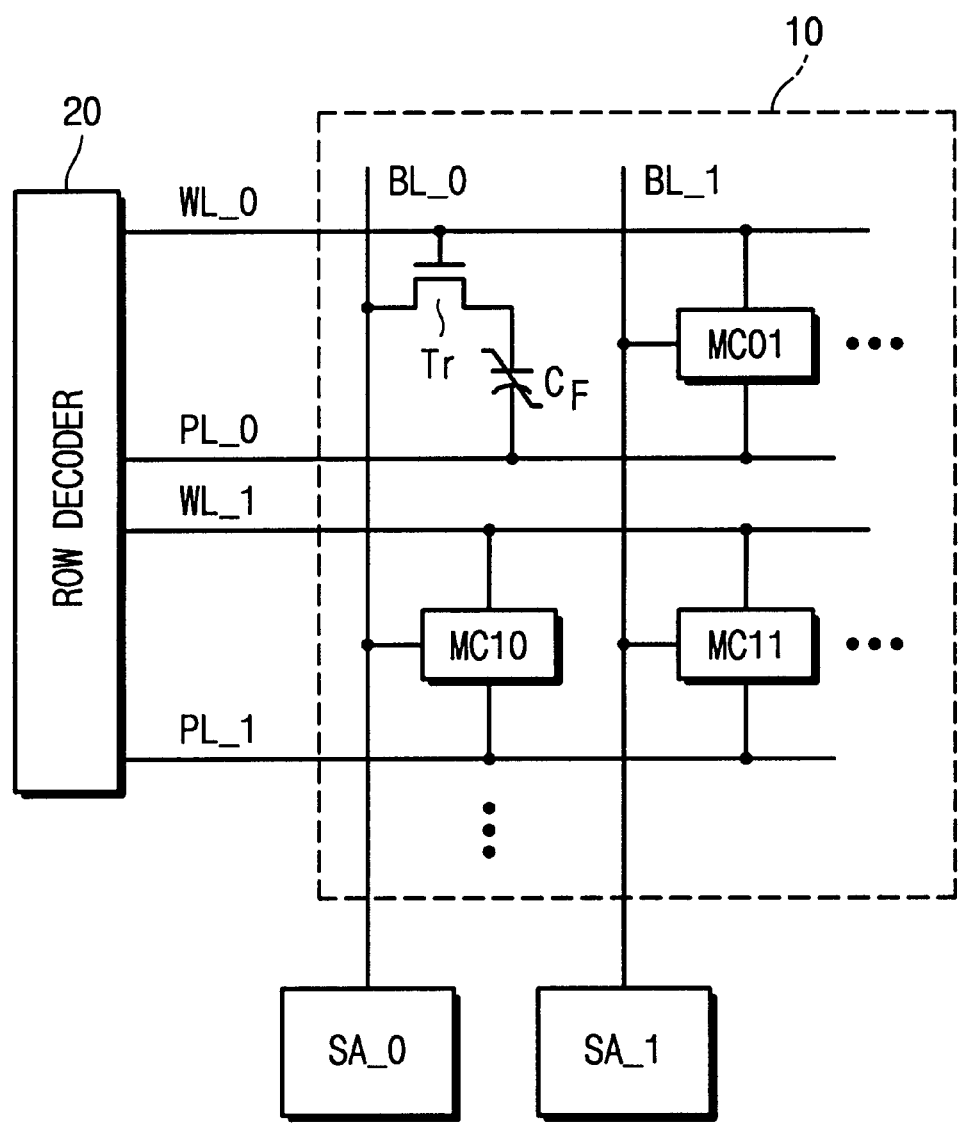
FIG. 2A is a block diagram illustrating a ferroelectric memory device in accordance with the prior art.
Figure 2B:
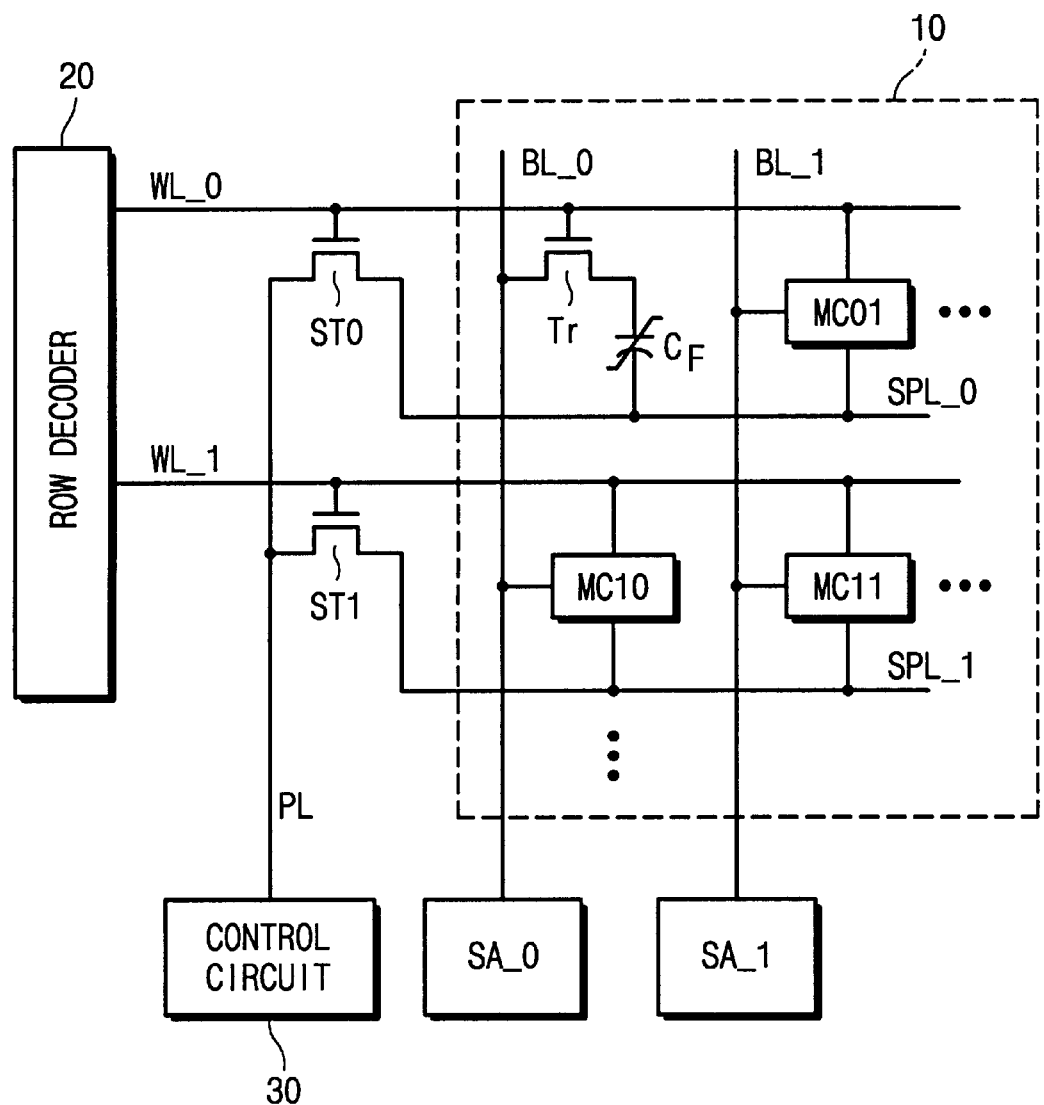
FIG. 2B is a block diagram illustrating another ferroelectric memory device in accordance with the prior art.

When the equalizer drive line REQ__B is activated, then the respective bit line pair BL__0B and BL__1B, BL__2B and BL__3B, . . . , or BL__62B and BL__63B have the same voltage (i.e., reference voltage) of about Vcc/2, since complementary data of a logic "one" data (Vcc) and a logic "zero" data (Vss) have been stored in a pair of adjacent reference cells of the each bit line BL__iT (i=0 1, . . . , or 63) reference cell array 104a, respectively. Thereafter, if a pulse voltage of Vcc is applied to the plate line PL__T while the access transistors Tr and RTr are conducting, then the charge stored in each of the capacitors $C_F$ and $RC_F$ is fed out onto a corresponding one of the bit lines BL__iT and BL__iB (i=0 1, . . . , 63). Referring to FIGS. 1B and 1C, the amount of the charge is Q1 if a ferroelectric is in the state at point 'a' (i.e., a logic "1"), but the amount of the charge is Q0 if the ferroelectric is in the state at point 'e' (i.e., a logic "1"). Thus, there occurs a voltage difference between each bit line BLU__iT (i=0, 1, . . . , or 63) and a corresponding bit line BL__iB.

At the time T1, two column gate drive lines Y__pT and Y__pB (p=0, 1, . . . , 15) are activated as soon as the reference word line RWL__B becomes inactive. Thus, write-in data externally applied via data lines SDL__0T, SDL__1T, SDL__2T and SDL__3T are applied to four corresponding bit lines (e.g., BL__0T, BL__1T, BL__2T and BL__3T) selected by column decoders 118 and 118a.

Subsequently, the latch sense amplifier circuit 102 is activated. When P-latch amp drive line SAP and N-latch amp drive line SAN are activated, a resulting change in voltage on each bit line BL__iT (i=0, 1, . . . , or 63) is detected and amplified by a corresponding latch sense amplifier by comparison with the reference voltage (Vcc/2) on a corresponding bit line BL__iB. Each latch sense amplifier, for example, amplifies the voltage on a corresponding bit line BL__1T (i=0, 1, . . . , or 63) to a first amplifying voltage (e.g., Vcc) if the bit line voltage is lower than the reference voltage (Vcc/2), whereas it amplifies the bit line voltage to a second amplifying voltage (e.g., Vss) if the bit line voltage is higher than the reference voltage. In this manner, the data is written into the corresponding memory cells (e.g., MC00, MC01, MC02 and MC03). Similarly, since latch sense amplifiers are activated after the column gate drive lines Y__pT and Y__pB (p=0, 1, , or 15), it is unnecessary to invert the state of the latch amplifier due to the disagreement between the sensed cell data and the externally applied write data, and this will result in the reduced current consumption and stable operation, compared to the prior art. Next, the complementary reference drive lines RFDIN and $\overline{\text{RFDIN}}$ go to high and low levels, respectively, and then the reference gate drive line RPS__B becomes activated. Thus, complementary data are stored in each adjacent reference cell pair (e.g., RMC0 and RMC1) of the reference cell arrays 104 and 104a. It will be understood that the capacitor should be pulsed again in order to retain correct data after the "1" bit has been read from the unselected capacitor. Thus, the plate line PL__T is pulsed once more in the interval T1-T2. Finally, the data write operation is terminated when the word line WL__0T is deactivated in the precharge period T2-T3 where the precharge drive lines BLP__T and BLP__B become activated.

In a read cycle, the time interval T3-T4 is a cell data sensing period for reading out cell data, and the following interval T4-T5 is an actual read and rewrite (or write-back) period. The time interval T5-T6 represents the precharge period.

At the time T3, the precharge drive lines BLP__T and the PLP__B are activated and P-latch amp drive line SAP and the N-latch amp drive line SAN both are deactivated. Thereafter, the word line WL__0T and the reference word line RWL__B are selected and the equalizer drive line REQ__B is activated after the precharge drive lines BLP__T and PLP__B has been deactivated. Then, plate line segment SPL__0T is selected by the plate select transistor M0 and the corresponding switching transistor M0c in the switch element 120 coupled between the selected word line WL__0T and the selected plate line segment SPL__0T is turned off. However, the switching devices M1c, M2c, . . . , Mmc in other switch elements coupled between the unselected word lines WL__1T, WL__2T, . . . , WL63 and the unselected plate line segments SPL__1T, SPL__2T, SPL__mT are turned on, so that the unselected plate line segments SPL__T, SPL__2T, SPL__mT all are grounded. Therefore, data disturbance due to the capacitive plate line segment coupling can be prevented since the unselected plate line segments SPL__1T, SPL__2T, . . . , SPL__mT are not floated. Thus, stable sensing margin can be assured without interference between adjacent signals.

The equalizer drive line REQ__B is activated as soon as the reference word line RWL__B becomes inactive. Then, the respective bit line pair BL__0B and BL__1B, BL__2B and BL__3B, , or BL__62B and BL__63B have the same voltage (i.e., reference voltage) of about Vcc/2, since complementary data of a logic "one" data (Vcc) and a logic "zero" data (Vss) have been stored in a pair of adjacent reference cells of the each bit line BL__iT (i=0, 1, . . . , or 63) reference cell array 104a, respectively. If a pulse voltage of Vcc is applied to the plate line PL__T while the access transistors Tr and RTr are conducting, then the charge stored in each of the capacitors $C_F$ and $RC_F$ is fed out onto a corresponding one of the bit lines BL__iT and BL__iB (i=0, 1, . . . , 63). Referring to FIG. 1B and 1C, the amount of the charge is Q1 if a ferroelectric is in the state at point 'a' (i.e., a logic "1"), but the amount of the charge is Q0 if the ferroelectric is in the state at point 'e' (i.e., a logic "0"). Thus, there occurs a voltage difference between each bit line BL__iT (i=0, 1, . . . , or 63) and a corresponding bit line BL__iB.

At the time T4 where the P-latch amp drive line SAP and the N-latch amp drive line SAN are activated, a resulting change in voltage on each bit line BL__iT (i=0, 1, . . . , or 63) is detected and amplified by a corresponding latch sense amplifier by comparison with the reference voltage (Vcc/2) on a corresponding bit line BL__iB. Each latch sense amplifier, for example, amplifies the voltage on a corresponding bit line BL__iT (i=0, 1, . . . , or 63) to a first amplifying voltage (e.g., Vcc) if the bit line voltage is lower than the reference voltage (Vcc/2), whereas it amplifies the bit line voltage to a second amplifying voltage (e.g., Vss) if the bit line voltage is higher than the reference voltage.

After the bit line levels have been developed stably, two column gate drive lines Y_pT and Y_pB (p=0, 1, . . . , 15) are activated. Thus, write-out data is outputted to data lines SDL_0T, SDL_T, SDL_2T and SDL_3T via column pass gate circuit 130. Like this, since latch sense amplifiers are activated prior to column gate drive lines Y_pT and Y_pB (p=0, 1, , or 15), the read-out data is outputted as stably as possible.

Next, the complementary reference drive lines RFDIN and $\overline{\text{RFDIN}}$ go to high and low levels, respectively, and then the reference gate drive line RPS_B becomes activated. Thus, complementary data are stored in each adjacent reference cell pair (e.g., RMC0 and RMC1) of the reference cell arrays 104 and 104a. The capacitor should be pulsed again in order to retain correct data after the "1" bit has been read from a memory cell. Thus, the plate line PL_T is pulsed once more in the interval T4-T5. Finally, the data read operation is terminated when the word line WL_0T is inactivated in the precharge period T5-T6 where the precharge drive lines BLP_T and BLP_B become activated.

Although the preferred embodiments of the present invention have been disclosed for illustrative purposes, numerous modifications and variations of the present invention are possible in light of the above teachings. It is therefore to be understood that, within the scope of the appended claims, the present invention can be practiced in a manner other than as specifically described herein.

What is claimed is:

1. A random access memory device, comprising:
   a plurality of word lines arranged in a first direction;
   a plurality of bit lines arranged in a second direction;
   a plate line;
   a plurality of plate line segments;
   a plate line driver for driving said plate line;
   an array of a plurality of memory cells arranged in the first and second directions, each memory cell being coupled to corresponding one of said word lines, a corresponding one of said bit lines and corresponding one of said plate line segments;
   a plate select circuit for selecting one of said plate line segments and coupling said selected plate line segment to said plate line in response to word line driving signals; and
   a floating protection circuit for protecting unselected ones of said plate line segments from being floated during a read/write operation.

2. The memory device of claim 1, wherein said floating protection circuit comprises a plurality of switch elements, each switch element being coupled between a corresponding one of said plate line segments and a reference voltage and closing/opening in response to a corresponding one of the word line driving signals.

3. The memory device claim 2, wherein said reference voltage is ground voltage.

4. The memory device of claim 1, wherein said floating protection circuit comprises a plurality of switching devices, each switching device having a conduction path coupled between a corresponding one of said plate line segments and a reference voltage and a control terminal; and a plurality of switch drivers for driving said switching devices in response to the word line driving signals.

5. The memory device of claim 4, wherein each of said switch drivers comprises an inverter having an input terminal coupled to a corresponding one of said word lines and an output terminal coupled to the control terminal of a corresponding one of said switching devices.

6. The memory device of claim 1, wherein each of said memory cells comprises a ferroelectric capacitor and an access transistor.

7. The memory device of claim 1, further comprising
   a reference word line arranged in the first direction;
   an array of a plurality of reference cells arranged in the first direction, each reference cell being coupled to said reference word line, corresponding one of said bit lines, and corresponding one of said first and second plate lines and generating a reference voltage; and
   a sense amplifier circuit including a plurality of sense amplifiers, each sense amplifier sensing a difference between the reference voltage and a voltage developed on a corresponding one of said bit lines and amplifying the difference voltage to one of predetermined first and second amplifying voltages.

8. A random access memory device, comprising:
   a first memory cell array including a plurality of first memory cells arranged in rows and columns;
   a second memory cell array including a plurality of second memory cells arranged in rows and columns;
   a plurality of first word lines arranged in rows, each first word line being coupled to the memory cells of corresponding row in said first memory cell array;
   a plurality of second word lines arranged in rows, each second word line being coupled to the memory cells of a corresponding row in said second memory cell array;
   a plurality of first bit lines arranged in columns, each first bit line being coupled to the memory cells of a corresponding column in said first memory cell array;
   a plurality of second bit lines arranged the columns, each second bit line being coupled to the memory cells of a corresponding column in said second memory cell array;
   a first reference cell array including a plurality of first reference memory cells arranged in a row and columns, each first reference cell providing a reference voltage to a corresponding second bit line;
   a second reference cell array including a plurality of second reference memory cells arranged in a row and columns, each second reference cell providing the reference voltage to a corresponding one of said first bit lines;
   a first reference word line arranged in a row and coupled to the first reference cells;
   a second reference word line arranged in a row and coupled to the second reference cells;
   a row decoder for driving one of said first word lines, one of said second word lines, and one of said first and second reference word lines;
   a first plate line coupled to said second reference cell array;
   a plurality of first plate line segments, said first plate line segments being coupled to the first memory cell array;
   a second plate line coupled to said first reference cell array;
   a plurality of second plate line segments, said second plate line segments being coupled to said second memory cell array;

a first column decoder for selecting one or more of said first bit lines;

a second column decoder for selecting one or more of said second bit lines;

a first plate line driver for driving said first plate line;

a second plate line driver for driving said second plate line;

a first plate select circuit for selecting one of said first plate line segments and coupling said selected first plate line segment to said first plate line in response to first word line driving signals;

a second plate select circuit for selecting one of said second plate line segments and coupling said selected second plate line segment to said second plate line in response to second word line driving signals;

a sense amplifier circuit including a plurality of sense amplifiers each sense amplifier sensing a difference between the reference voltage on corresponding one of said first/second bit lines and a voltage developed on a corresponding one of said second/first bit lines and amplifying the difference voltage to one of predetermined first and second amplifying voltages.

9. The memory device of claim 8, further comprising a floating protection circuit for protecting unselected ones of said first and second plate line segments from being floated during a read/write operation.

10. The memory device of claim 9, wherein said floating protection circuit comprises a plurality of switch elements, each switch element being coupled between a corresponding one of said plate line segments and a second reference voltage and closing/opening in response to a corresponding one of said first and second word line driving signals.

11. The memory device claim 10, wherein said second reference voltage is ground voltage.

12. The memory device of claim 9, wherein said floating protection circuit comprises a plurality of switching devices, each switching device having a conduction path coupled between a corresponding one of said plate line segments and a second reference voltage and a control terminal; and a plurality of switch drivers each providing a switch driving signal to the control terminal of a corresponding one of said switching devices in response to a corresponding one of said first and second word line driving signals.

13. The memory device of claim 12, wherein each of said switch drivers comprises an inverter having an input terminal coupled to a corresponding one of said word lines and an output terminal coupled to the control terminal of a corresponding one of said switching devices.

14. The memory device of claim 8, wherein each of said memory cells comprises a ferroelectric capacitor having a first plate electrode coupled to a corresponding plate line segment, and a second plate electrode; and an access transistor having a conduction path of which first and second ends are coupled to a corresponding bit line and said second plate electrode of said ferroelectric capacitor, respectively, and a control electrode coupled to a corresponding word line.

15. The memory device of claim 8, wherein said first plate select circuit comprises a plurality of first field effect transistors each first field effect transistor having a conduction path coupled between the first plate line and a corresponding first plate line segment and a control electrode coupled to a corresponding first word line; and said second plate select circuit comprises a plurality of second field effect transistors, each second field effect transistor having a conduction path coupled between the second plate line and a corresponding second plate line segment and a control electrode coupled to a corresponding second word line.

16. A nonvolatile ferroelectric random access memory device, comprising:

a plurality of first word lines arranged in rows;

a plurality of second word lines arranged in rows;

first and second reference word lines arranged in rows;

a row decoder for driving said word lines and said reference word line pair; and a plurality of memory blocks, each memory block including:

a plurality of first bit lines arranged in columns, a plurality of second bit lines arranged in the columns, a first memory cell array including a plurality of first ferroelectric memory cells that are arranged in rows and columns, wherein each first ferroelectric memory cell is coupled to a corresponding first word line, a second memory cell array including a plurality of second ferroelectric memory cells that are arranged in rows and columns, wherein each second ferroelectric memory cell is coupled to a corresponding second word line, a first reference cell array including a plurality of first reference cells that are arranged in a row and columns, wherein said first reference cells all are coupled to the first reference word line and each first reference cell provides a reference voltage to a corresponding first bit line, a second reference cell array including a plurality of second reference cells that are arranged in a row and columns, wherein said second reference cells all are coupled to the second reference word line and each second reference cell provides the reference voltage to a corresponding second bit line, a first plate line couple to said second reference cells;

a plurality of first plate line segments arranged into rows, wherein each first plate line segment is coupled to the first ferroelectric memory cells of a row;

a second plate line coupled to said first reference cells;

a plurality of first plate line segrments arranged into rows, wherein each second plate line segment is coupled to the second ferroelectric memory cells of a row;

a first column decoder for selecting one or more of said first bit lines, a second column decoder for selecting one or more of said second bit lines, a first plate line driver for driving said first plate line, a second plate line driver for driving said second plate line, a plurality of first plate select transistors, each having a conduction path coupled between the first plate line and a corresponding first plate line segment and a control electrode coupled to a corresponding first word line, a plurality of second plate select transistors, each having a conduction path coupled between the second plate line and a corresponding second plate line segment and a control electrode coupled to a corresponding second word line, and a sense amplifier circuit including a plurality of sense amplifiers each sense amplifier sensing a difference between the reference voltage on corresponding one of said first/second bit lines and a voltage developed on corresponding one of said second/first bit lines and amplifying the difference voltage to one of predetermined first and second amplifying voltages.

17. The memory device of claim 16, wherein said memory blocks each further comprise a floating protection circuit for protecting unselected ones of said first and second plate line segments from being floated during a read/write operation.

18. The memory device of claim 17, wherein said floating protection circuit comprises a plurality of switch elements, each switch element being coupled between a corresponding one of said plate line segments and a second reference voltage and closing/opening in response to a word line driving signal.

19. A method of writing a data bit into a random access memory which includes a ferroelectric cell capacitor, a bit line, a word line, and an access transistor having a conduction path coupled between said bit line and said ferroelectric cell capacitor and a control electrode coupled to said word line, a column pass gate for selecting said bit line in response to a column selecting signal, and a sense amplifier coupled to said bit line, the method comprising the steps of:

selecting said word line to make said access transistor conductive;

selecting said bit line;

applying a voltage corresponding to the data bit to said bit line; and sensing and amplifying a difference between the voltage developed on said bit line and a reference voltage.

* * * * *